United States Patent
Deguchi

(10) Patent No.: US 10,622,280 B2
(45) Date of Patent: Apr. 14, 2020

(54) SEMICONDUCTOR DEVICE

(71) Applicant: TOYOTA JIDOSHA KABUSHIKI KAISHA, Toyota-shi, Aichi-ken (JP)

(72) Inventor: Masataka Deguchi, Nagoya (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 16/270,944

(22) Filed: Feb. 8, 2019

(65) Prior Publication Data
US 2019/0252293 A1 Aug. 15, 2019

(30) Foreign Application Priority Data
Feb. 14, 2018 (JP) ................................. 2018-024504

(51) Int. Cl.
*H01L 23/40* (2006.01)
*H01L 23/473* (2006.01)
*H01L 23/433* (2006.01)
*F28F 21/02* (2006.01)

(52) U.S. Cl.
CPC .......... *H01L 23/4012* (2013.01); *F28F 21/02* (2013.01); *H01L 23/4334* (2013.01); *H01L 23/473* (2013.01); *H01L 2023/4031* (2013.01); *H01L 2023/4068* (2013.01)

(58) Field of Classification Search
CPC ....................... H01L 23/4012; H01L 23/4334; H01L 23/473
See application file for complete search history.

(56) References Cited

U.S. PATENT DOCUMENTS

| 8,547,697 B2 * | 10/2013 | Fukutani | H01L 25/072 165/80.4 |
| 8,755,185 B2 * | 6/2014 | Chou | H01L 23/3735 165/80.4 |
| 9,768,095 B2 * | 9/2017 | Sasaki | H01L 23/3736 |
| (Continued) | | | |

FOREIGN PATENT DOCUMENTS

JP 2007-165620 A 6/2007
JP 2017-112334 A 6/2017

OTHER PUBLICATIONS

U.S. Appl. No. 16/160,295, filed Oct. 15, 2018 in the name of Deguchi.

*Primary Examiner* — Jose R Diaz
(74) *Attorney, Agent, or Firm* — Oliff PLC

(57) ABSTRACT

A semiconductor device includes a semiconductor element, a cooler, and a heat conductive body. The cooler faces one surface of the semiconductor element, and has a flow passage of a coolant. As viewed from the flow direction of the coolant, a width of the flow passage is wider than a width of the semiconductor element. The heat conductive body is made from graphite having such an anisotropy that a heat conductivity in the in-plane direction of a predetermined surface is higher than a heat conductivity in the normal direction of the predetermined surface. The width of the heat conductive body is wider than the width of the semiconductor element as viewed from the flow direction of the coolant. The heat conductive body is configured such that the predetermined surface is non-parallel to both of the flow direction of the coolant and the one surface of the semiconductor element.

4 Claims, 7 Drawing Sheets

(56) References Cited

U.S. PATENT DOCUMENTS 10,483,186 B2* 11/2019 Deguchi ................ F28F 21/02
2007/0215325 A1* 9/2007 Solovitz ............... H01L 23/473
165/80.4

* cited by examiner

US 10,622,280 B2

SEMICONDUCTOR DEVICE

INCORPORATION BY REFERENCE

The disclosure of Japanese Patent Application No. 2018-024504 filed on Feb. 14, 2018 including the specification, drawings and abstract is incorporated herein by reference in its entirety.

BACKGROUND

1. Technical Field

A technique disclosed in the present specification relates to a semiconductor device. In particular, the technique relates to a semiconductor device including a semiconductor element and a cooler cooling the semiconductor element.

2. Description of Related Art

Japanese Patent Application Publication No. 2007-165620 discloses a semiconductor device including semiconductor modules accommodating semiconductor elements, and coolers. Each semiconductor module is in a flat shape, and heat conductive bodies are exposed on both wide-width surfaces of the module. Each heat conductive body is in contact with the semiconductor element inside the package of the semiconductor module, and is also in contact with the cooler outside the package. The coolers are in contact with the both surfaces of the semiconductor module, and the coolers absorb heat of the semiconductor element via the heat conductive bodies from the both sides of the semiconductor module.

In the meantime, currently, as a material with a high heat conductivity, increased attention is being focused on graphite that is anisotropic in heat conductivity. Graphite has a significantly higher heat conductivity in the in-plane direction of its predetermined surface than a heat conductivity in the normal direction of the predetermined surface.

SUMMARY

The present disclosure provides a technique that effectively utilizes characteristics of a heat conductive body made from graphite strongly anisotropic in heat conductivity, and enhances cooling performance in a semiconductor device including a cooler that cools a semiconductor element with a coolant.

A semiconductor device disclosed by the present disclosure, includes: a semiconductor element; a cooler; and a heat conductive body. The cooler faces one surface of the semiconductor element and has a flow passage of a coolant. As viewed from a flow direction of the coolant, a width of the flow passage is wider than a width of the semiconductor element. The heat conductive body is disposed between the semiconductor element and the cooler, and includes graphite having such an anisotropy that a heat conductivity in an in-plane direction of a predetermined surface is higher than a heat conductivity in a normal direction of the predetermined surface. A width of the heat conductive body is wider than the width of the semiconductor element as viewed from the flow direction of the coolant. The heat conductive body is configured such that the predetermined surface is non-parallel to both of the flow direction of the coolant and the one surface of the semiconductor element.

Hereinafter, for convenience of explanation, in the heat conductive body, the predetermined surface having a higher heat conductivity is also referred to as a high heat-transfer surface. With the semiconductor device, the high heat-transfer surface is non-parallel to one surface of the semiconductor element. Specifically, the high heat-transfer surface spreads from the semiconductor element toward the cooler, to thereby sufficiently transfer heat from the semiconductor element toward the cooler. With the above semiconductor device, the width of the heat conductive body is wider than the width of the semiconductor element, and the high heat-transfer surface is also non-parallel to the flow direction of the coolant. With this structure, as viewed from the flow direction of the coolant, heat is transferred so as to spread from the semiconductor element toward the cooler via the heat conductive body. It is possible to efficiently transfer the heat to the coolant flowing through the coolant flow passage with a wider width than the width of the semiconductor element.

In the semiconductor device, the predetermined surface of the graphite may be orthogonal to the one surface of the semiconductor element. With this configuration, the heat transfer path along the high heat-transfer surface, ranging from the semiconductor element to the cooler, becomes the shortest.

In the semiconductor device, as viewed from the normal direction of the one surface of the semiconductor element, the predetermined surface of the graphite may intersect the flow direction of the coolant at an angle within a range of 45 to 90 degrees. With this configuration, the heat transfer path from the semiconductor element outward of the width direction of the semiconductor element becomes the shortest.

In the semiconductor device, the heat conductive body may be covered with metal. Since graphite is relatively fragile, by covering the heat conductive body with metal, durability of the heat conductive body can be enhanced.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

Figure 1:
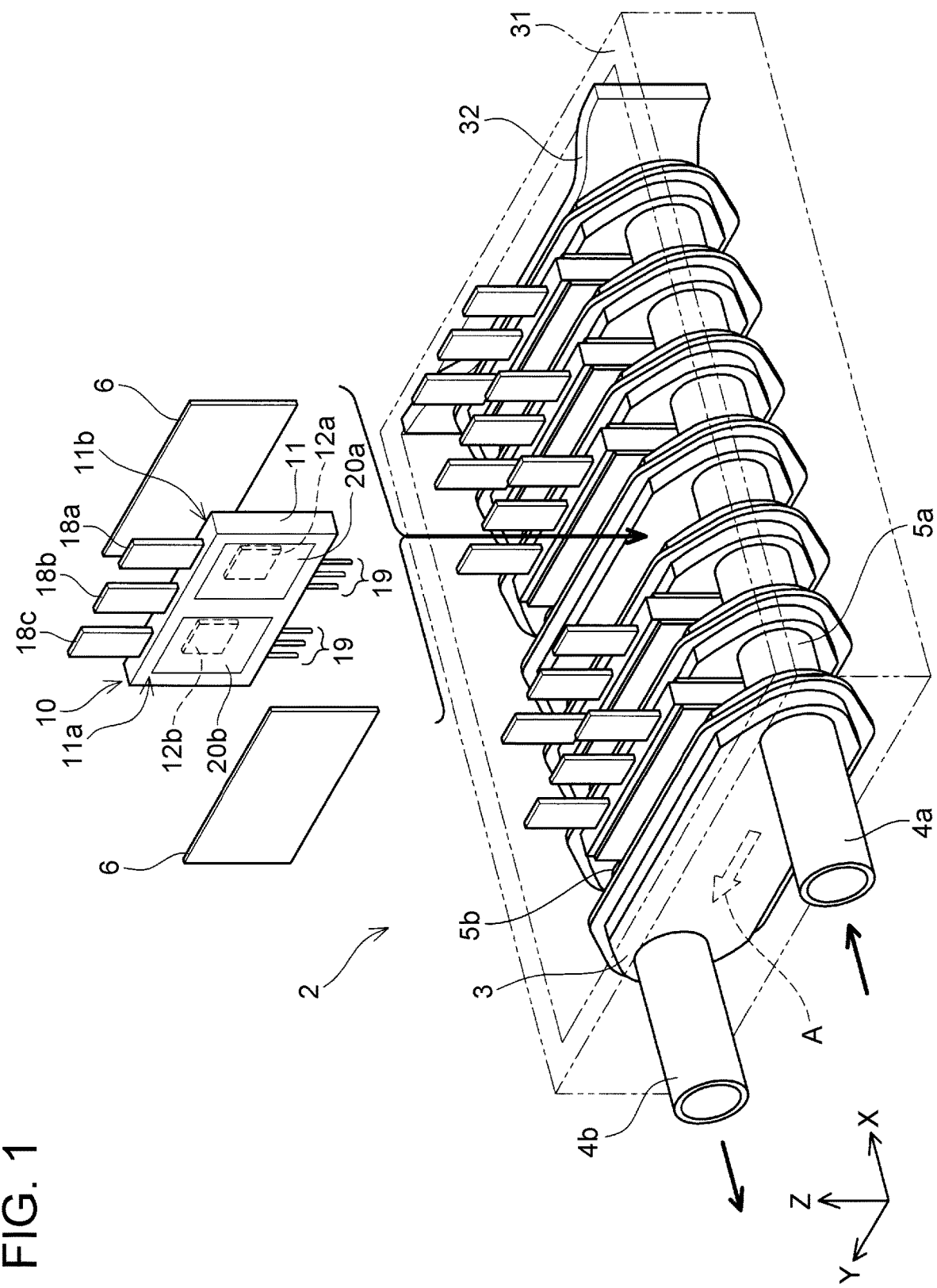
FIG. 1 is a perspective view of a semiconductor device of a first embodiment.

A semiconductor device 2 of the first embodiment will be described with reference to the drawings. FIG. 1 shows a perspective view of the semiconductor device 2. The semiconductor device 2 is an electric power converter. The semiconductor device 2 is a device formed by stacking multiple semiconductor modules 10 and multiple coolers 3. Semiconductor elements 12a, 12b are accommodated in each of the semiconductor modules 10. In FIG. 1, a reference numeral 10 is added to only one semiconductor module, and the reference numeral for the other semiconductor modules is omitted. In FIG. 1, a reference numeral 3 is added to only one cooler, and the reference numeral for the other coolers is omitted. In addition, for the purpose of showing the entire semiconductor device 2, a case 31 in which the semiconductor device 2 is accommodated is illustrated by imaginary lines.

Each single semiconductor module 10 is disposed between two coolers 3. Electric insulating plates 6 are interposed respectively between the semiconductor module 10 and one cooler 3 and between the semiconductor module 10 and another cooler 3. In FIG. 1, for the purpose of easy understanding, only a single semiconductor module 10 and the electric insulating plates 6 located on both sides of this semiconductor module 10 are extracted and illustrated.

Each of the semiconductor modules 10 and the coolers 3 is in a flat plate-like shape, and they are stacked such that flat surfaces having maximum arears (wide-width surfaces) of multiple side surfaces face each other. The semiconductor modules 10 and the coolers 3 are alternately stacked, and the coolers are disposed also on the both sides in the stacking direction of the semiconductor device 2. The coolers 3 configure a simple flow passage inside of which a coolant flows. The multiple coolers 3 are connected to one another via connecting pipes 5a, 5b. A coolant supply pipe 4a and a coolant exhaust pipe 4b are connected to the cooler 3 located on one end in the stacking direction of the semiconductor device 2. The coolant supplied through the coolant supply pipe 4a is distributed to all the coolers 3 through the connecting pipes 5a. The coolant absorbs heat from the semiconductor modules 10 adjacent to the coolant while the coolant flows through the respective coolers 3. The coolant having passed through the respective coolers 3 passes through the connecting pipes 5b, and is then exhausted from the coolant exhaust pipe 4b. An arrow A in FIG. 1 indicates a flow direction of the coolant. A plus direction of a Y-axis in a coordinate system in FIG. 1 (hereinafter, also referred to as a +Y direction) corresponds to the flow direction of the coolant inside the respective coolers 3. In the other drawings, the +Y direction coincides with the flow direction of the coolant. The coolant is a liquid, and specifically, water or an antifreeze liquid.

The semiconductor device 2 is accommodated, along with a plate spring 32 disposed at one end in the stacking direction of the semiconductor device 2, in the case 31. The plate spring 32 pressurizes the semiconductor device 2 formed by stacking the semiconductor modules 10, the electric insulating plates 6, and the coolers 3, from the both sides in the stacking direction. The pressurization in the stacking direction allows the semiconductor modules 10, the electric insulating plates 6, and the coolers 3 to be in tight contact with one another, to thereby enhance cooling performance.

Description will be provided on the semiconductor module 10. The semiconductor module 10 is a device in which semiconductor elements 12a, 12b are sealed in a package 11 made of resin. The semiconductor elements 12a, 12b are switching elements for electric power conversion, and specifically, an insulated gate bipolar transistor (IGBT) or a metal oxide semiconductor field effect transistor (MOSFET). Heat sinks 20a, 20b are exposed on one wide-width surface 11a facing the electric insulating plate 6. Other heat sinks 20c, 20d (not shown in FIG. 1) are exposed on the other wide-width surface 11b opposite to the wide-width surface 11a. The semiconductor element 12a is disposed between the heat sinks 20a and 20c, and the semiconductor element 12b is disposed between the heat sinks 20b and 20d. Although detailed description will be provided later, the heat sinks 20a to 20d are heat conductive bodies covered with copper. The heat conductive bodies are made from graphite.

Collector electrodes are exposed on one surfaces of the semiconductor elements 12a, 12b, and emitter electrodes are exposed on the other surfaces thereof. The heat sinks 20a, 20b, 20c, 20d are electrically connected to any electrode of the semiconductor elements 12a, 12b inside the package 11.

Three terminals 18a, 18b, 18c extend from one narrow-width surface of the package 11 of the semiconductor module 10, and control terminals 19 extend from the other narrow-width surface thereof. Inside the package 11, the two semiconductor elements 12a, 12b are connected in series; and a positive electrode terminal 18a (negative electrode terminal 18b) is electrically connected to a positive electrode (negative electrode) side of the series connection of the two semiconductor elements 12a, 12b, inside the package 11. A midpoint terminal 18c is electrically connected to a midpoint of the series connection of the two semiconductor elements 12a, 12b, inside the package 11. The terminals 18a to 18c are electrically connected to electrodes of the semiconductor elements 12a, 12b via any of the heat sinks 20a to 20d. Description of an electric conductive path between the semiconductor elements 12a, 12b and the terminals 18a to 18c is omitted. The control terminals 19 are connected to respective terminals of gate electrodes, sense emitter electrodes, temperature sensors, and others of the semiconductor elements 12a, 12b. Illustration and description of wiring of the control terminals 19 inside the package 11 are also omitted.

The heat sinks 20a to 20d play a role of transferring heat of the semiconductor elements 12a, 12b to the coolers 3 as well as a role of connecting the electrodes of the semiconductor elements 12a, 12b to the terminals 18a to 18c. Since the heat sinks 20a to 20d are electrically connected to the semiconductor elements 12a, 12b, the electric insulating plate 6 is interposed between each semiconductor module 10 and each cooler 3. The cooler 3 is made of metal having a high heat conductivity, such as aluminum, for example, and thus has an electric conductivity. Parts between the semiconductor modules 10 and the electric insulating plates 6 and parts between the electric insulating plates 6 and the coolers 3 are respectively greased. The grease is applied for the purpose of enhancing heat transfer efficiency.

Figure 2:
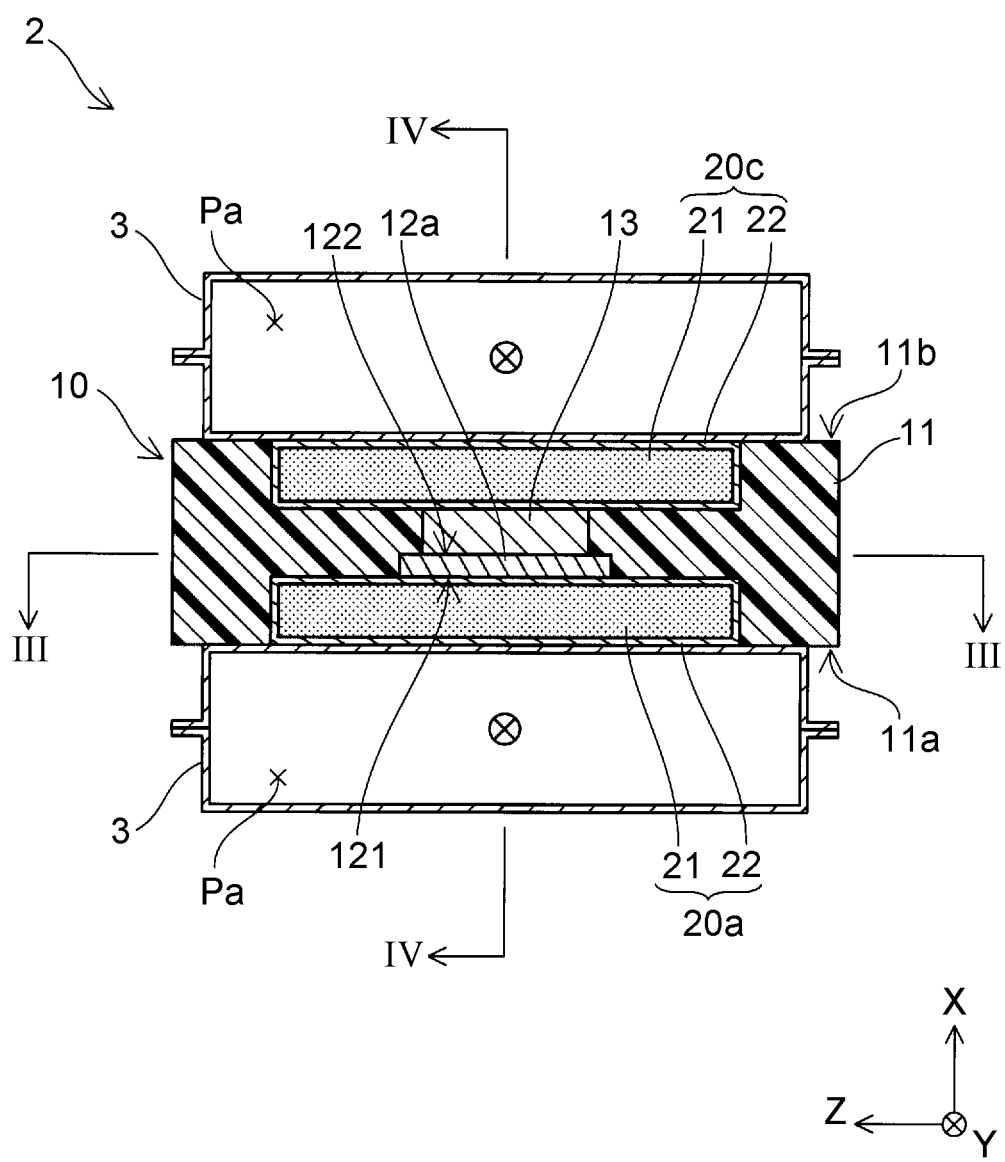
FIG. 2 is a sectional view of the semiconductor device taken along an X-Z plane.

FIG. 2 shows a sectional view of the semiconductor device 2 taken along an X-Z plane in a coordinate system in the drawing. FIG. 2 is a sectional view taken along the plane passing through the semiconductor element 12a. As described above, the semiconductor element 12a is disposed between the pair of heat sinks 20a, 20c. The semiconductor element 12a is a flat chip, and a collector electrode is exposed on one wide-width surface 121, and an emitter electrode is exposed on the other wide-width surface 122. The one heat sink 20a faces the wide-width surface 121 of the semiconductor element 12a. The heat sink 20a is joined and electrically connected to the collector electrode exposed on the wide-width surface 121. The other heat sink 20c faces the wide-width surface 122. The heat sink 20c is joined and electrically connected to the emitter electrode of the semiconductor element 12 with a spacer 13 interposed therebetween. The heat sink 20c is thermally connected to the semiconductor element 12a via the spacer 13.

The pair of coolers 3 disposed with the semiconductor element 12a interposed therebetween respectively face the wide-width surfaces 121, 122 of the semiconductor element 12a. Heat of each semiconductor element 12 is absorbed by the coolers 3 through the heat sinks 20a, 20c. Each cooler 3 has a hollow inside, and this hollow inside serves as a flow passage Pa of the coolant. In FIG. 2, the coolant flows in the +Y direction, that is, from the front side toward the depth side in the drawing.

As described above, the heat sinks 20a, 20c each have a structure that is formed by covering the heat conductive body 21 made from graphite with a copper plate 22. The heat conductive body 21 (graphite) is a material having such an anisotropy that a heat conductivity in an in-plan direction of a predetermined surface is higher than a heat conductivity in a normal direction of the predetermined surface. Hereinafter, the surface having a higher heat conductivity is referred to as a high heat-transfer surface. In general, the heat conductivity of the high heat-transfer surface of the graphite is approximately 800 to 1900 W/mK. This value is higher than a heat conductivity of copper (Cu) (approx. 390 W/mK) and a heat conductivity of silver (Ag) (approx. 420 W/mK). On the other hand, the heat conductivity in the normal direction of the high heat-transfer surface of the graphite is approximately 3 to 10 W/mK, which is low. In the semiconductor device 2, the anisotropy of the graphite is effectively utilized so as to enhance cooling efficiency of the semiconductor elements.

Figure 3:
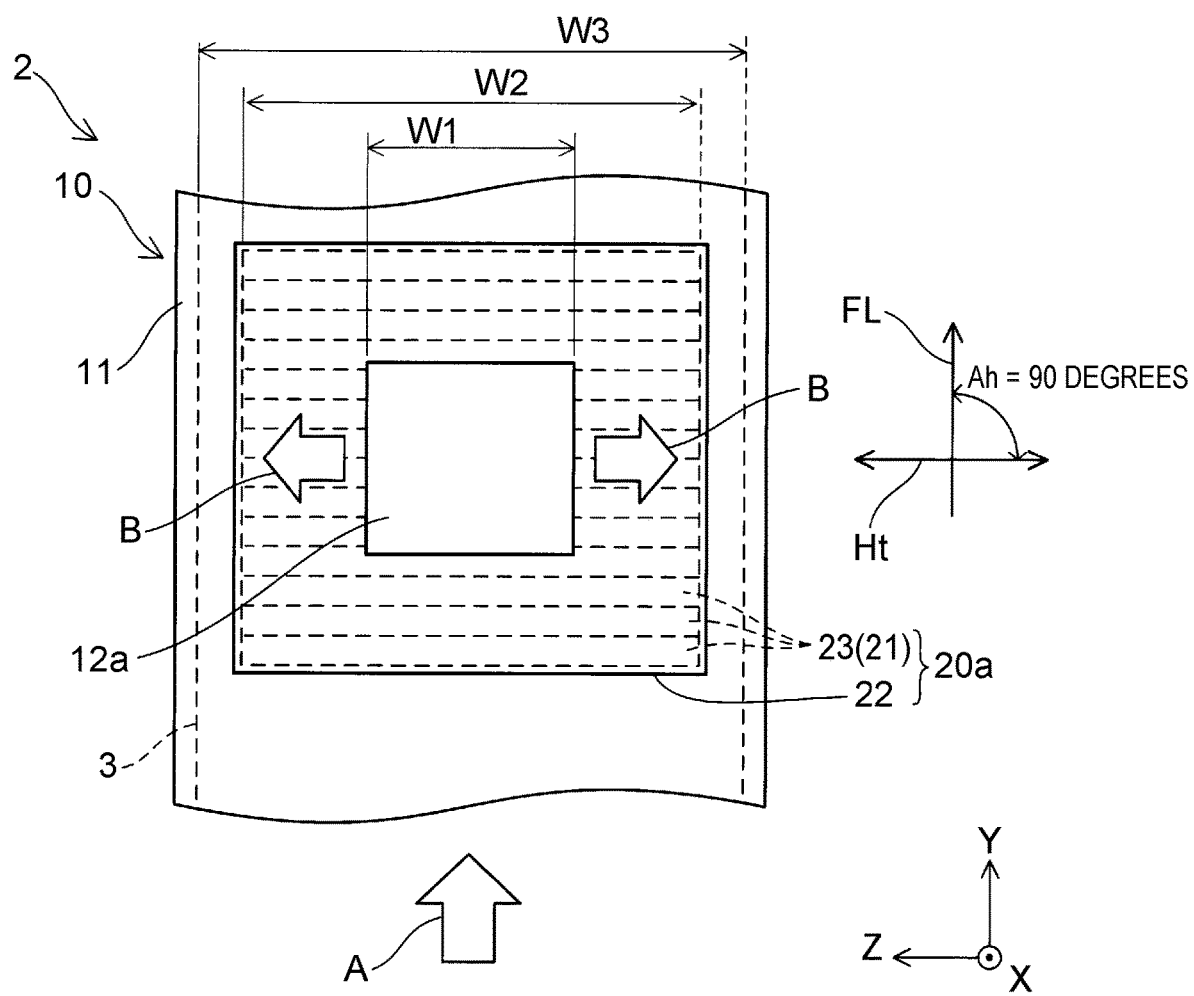
FIG. 3 is a sectional view of the semiconductor device taken along a line III-III of FIG. 2.
Figure 4:
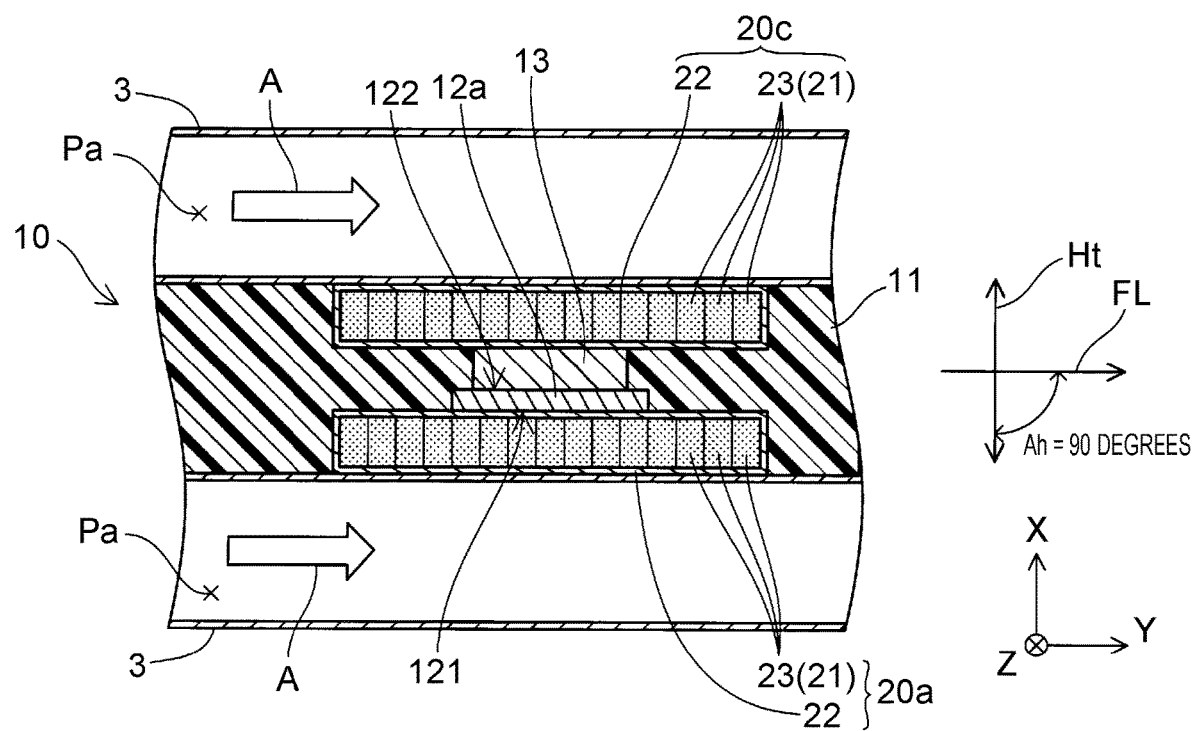
FIG. 4 is a sectional view of the semiconductor device taken along a line IV-IV of FIG. 2.

FIG. 3 shows a sectional view of the semiconductor device 2 taken along a line of FIG. 2. In FIG. 3, only outer outlines of the package 11 of each semiconductor module 10 are illustrated by solid lines, and the semiconductor element 12a and the heat sink 20a (copper plate 22 covering the heat conductive body 21), which are embedded in the package 11, are illustrated by solid lines. FIG. 4 shows a sectional view of the semiconductor device 2 taken along a line IV-IV of FIG. 2. In FIG. 3, FIG. 4, arrows A indicate respective flow directions of the coolant.

The heat conductive body 21 is formed by stacking multiple graphite sheets 23. In FIG. 3, FIG. 4, a reference numeral "23" is added to some of the graphite sheets, and the reference numeral for the rest of the graphite sheets is omitted. Sheet surfaces of the graphite sheets 23 correspond to the high heat-transfer surface. In FIG. 3, FIG. 4, an X-Z plane in the coordinate system in the drawing is parallel to the high heat-transfer surface.

In FIG. 3 and FIG. 4, an arrow line Ht illustrated on the right side in each drawing indicates a direction of the high heat-transfer surface. An arrow line FL illustrated on the right side in each drawing indicates the flow direction of the coolant. In the semiconductor device 2, the high heat-transfer surface (arrow line Ht) of the heat conductive body 21 intersects the flow direction of the coolant (arrow line FL) at an angle of 90 degrees. A sign Ah in each of FIG. 3 and FIG. 4 indicates an angle defined between the high heat-transfer surface and the flow direction of the coolant. The Y-Z plane in the coordinate system in each drawing is parallel to the wide-width surface 121 of the semiconductor element 12a. The high heat-transfer surface (arrow line Ht) of the heat conductive body 21 also intersects the wide-width surface 121 of the semiconductor element 12a at an angle of 90 degrees. In other words, the high heat-transfer surface is orthogonal to the flow direction of the coolant, and also orthogonal to the wide-width surface 121 of the semiconductor element.

As shown in FIG. 3, as viewed from the flow direction of the coolant, a width W2 of the heat conductive body 21 is wider than a width W1 of the semiconductor element 12a. A width W3 of the flow passage of the coolant is wider than the width W2 of the heat conductive body 21.

Since the high heat-transfer surface of the heat conductive body 21 intersects the wide-width surface 121 of the semiconductor element 12a, the high heat-transfer surface is configured to spread from the semiconductor element 12a to the cooler 3. Therefore, heat is sufficiently transferred from the semiconductor element 12a to the cooler 3. Particularly, since the high heat-transfer surface is orthogonal to the wide-width surface 121, a heat transfer path along the high heat-transfer surface, ranging from the semiconductor element 12a to each cooler 3, becomes the shortest. Accordingly, in the case in which the high heat-transfer surface is orthogonal to the wide-width surface 121, heat is most efficiently transferred from the semiconductor element 12a to each cooler 3.

In addition, the width W2 of the heat conductive body 21 is wider than the width W1 of the semiconductor element 12a, and the high heat-transfer surface (arrow line Ht) of the heat conductive body 21 is orthogonal to the flow direction of the coolant (arrow line FL). With this structure, as viewed from the flow direction of the coolant, the heat is transferred from the semiconductor element 12a toward each cooler 3 so as to spread through each heat conductive body 21. Arrows B in FIG. 3 schematically show a condition that the heat spreads outward from the semiconductor element 12a.

Figure 5:
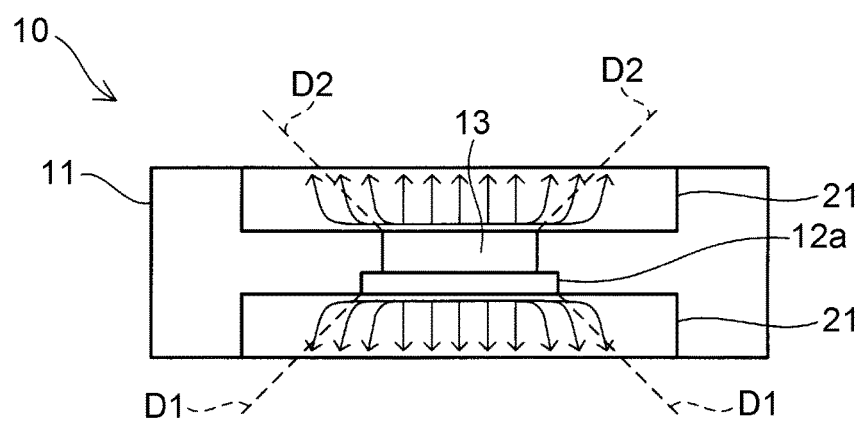
FIG. 5 is a view explaining a heat transfer path from a semiconductor element to coolers.

FIG. 5 shows a drawing corresponding to a cross section of FIG. 2, in which no hatching indicating the cross section is illustrated. In FIG. 5, the heat transfer direction in which heat is transferred from the semiconductor element 12a toward the coolers 3 through the heat conductive bodies 21 is schematically illustrated by arrow lines. In FIG. 5, the coolers 3 are disposed on and under the semiconductor module 10, but illustrations of the coolers 3 are omitted.

Broken lines D1 in FIG. 5 indicate lines extending from an edge of the semiconductor element 12a so as to spread toward the cooler 3 at an angle of 45 degrees, and broken lines D2 indicate lines extending from an edge of the spacer 13 so as to spread toward the cooler 3 at an angle of 45 degrees. In FIG. 5, the high heat-transfer direction is a direction parallel to the plane of the drawing. The heat of the semiconductor element 12a generally spreads along the broken lines D1, D2. As shown in FIG. 5, as viewed from the flow direction (direction Y in the drawing) of the coolant, the heat is transferred from the semiconductor element 12a (spacer 13) toward the coolers 3 so as to spread inside the heat conductive bodies 21 in the outward direction of the semiconductor element 12a. The high heat-transfer surface is orthogonal to the flow direction of the coolant, and thus the heat of the semiconductor element 12 is transferred to spread toward the coolers 3. Hence, a high cooling performance can be attained.

The relationship between the semiconductor element 12b and the heat sinks 20b, 20d located with the semiconductor element 12b interposed therebetween is the same as the relationship between the semiconductor element 12a and the heat sinks 20a, 20c.

Figure 6:
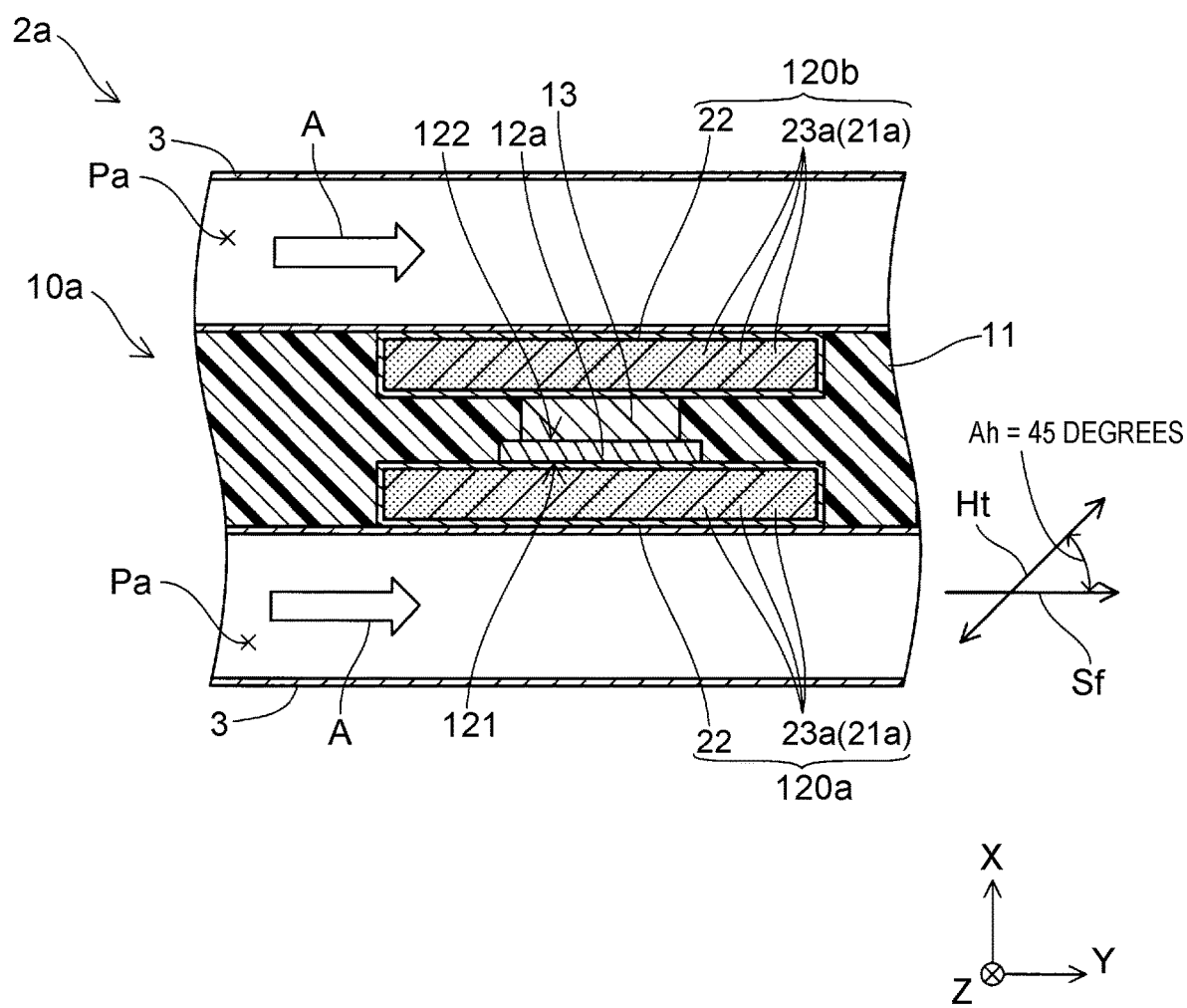
FIG. 6 is a sectional view of the semiconductor device of a first variation.

A semiconductor device 2a of the first variation will be described with reference to FIG. 6. FIG. 6 is a sectional view corresponding to FIG. 4. Arrows A indicate a flow direction of the coolant. In the semiconductor device 2a of the first variation, each semiconductor module 10a is held between a pair of the coolers 3. The semiconductor element 12a is embedded in the package 11 of the semiconductor module 10a. The semiconductor element 12a is disposed between a pair of heat sinks 120a, 120b inside the package 11. The heat sink 120a is joined to one wide-width surface 121 of the semiconductor element 12a. The heat sink 120b is thermally connected via the spacer 13 to the other wide-width surface 122 of the semiconductor element 12a.

The heat sinks 120a, 120b are blocks each of which is formed by covering a heat conductive body 21a with the copper plate 22. Each heat conductive body 21a is formed by stacking multiple graphite sheets 23a. In FIG. 6, a reference numeral "23a" is added to some of the graphite sheets, and the reference numeral for the rest of the graphite sheets is omitted. Sheet surfaces of the graphite sheets 23a correspond to the high heat-transfer surface having a high heat conductivity.

In FIG. 6, the high heat-transfer surface is disposed at an angle of 45 degrees relative to the X-Z plane in the coordinate system in the drawing. An arrow line Ht illustrated on the right side of FIG. 6 indicates an in-plane direction of the high heat-transfer surface. An arrow line Sf indicates a direction parallel to the wide-width surface 121 of the semiconductor element 12a. In the semiconductor device of the first variation, the high heat-transfer surface (arrow line Ht) of the heat conductive body 21a intersects the wide-width surface 121 at an angle of 45 degrees. A sign An of FIG. 6 indicates an intersection angle between the high heat-transfer surface and the wide-width surface. The high heat-transfer surface is orthogonal to the flow direction (direction indicated by the arrows A in the drawing) of the coolant, as viewed from the normal direction (X direction in the drawing) of the wide-width surface.

The high heat-transfer surface (arrow line Ht) of each heat conductive body 21a intersects the wide-width surface 121 (arrow line Sf) at an angle of 45 degrees; therefore, although inferior to the case of the orthogonal intersection, the high heat-transfer surface spreads from the semiconductor element 12a to each cooler 3. Therefore, heat is sufficiently transferred from the semiconductor element 12a toward the coolers 3. The high heat-transfer surface may be non-parallel to the wide-width surface (surface facing each cooler 3) of the semiconductor element 12a. However, it is preferable that the high heat-transfer surface is orthogonal to the wide-width surface of the semiconductor element 12a.

Figure 7:
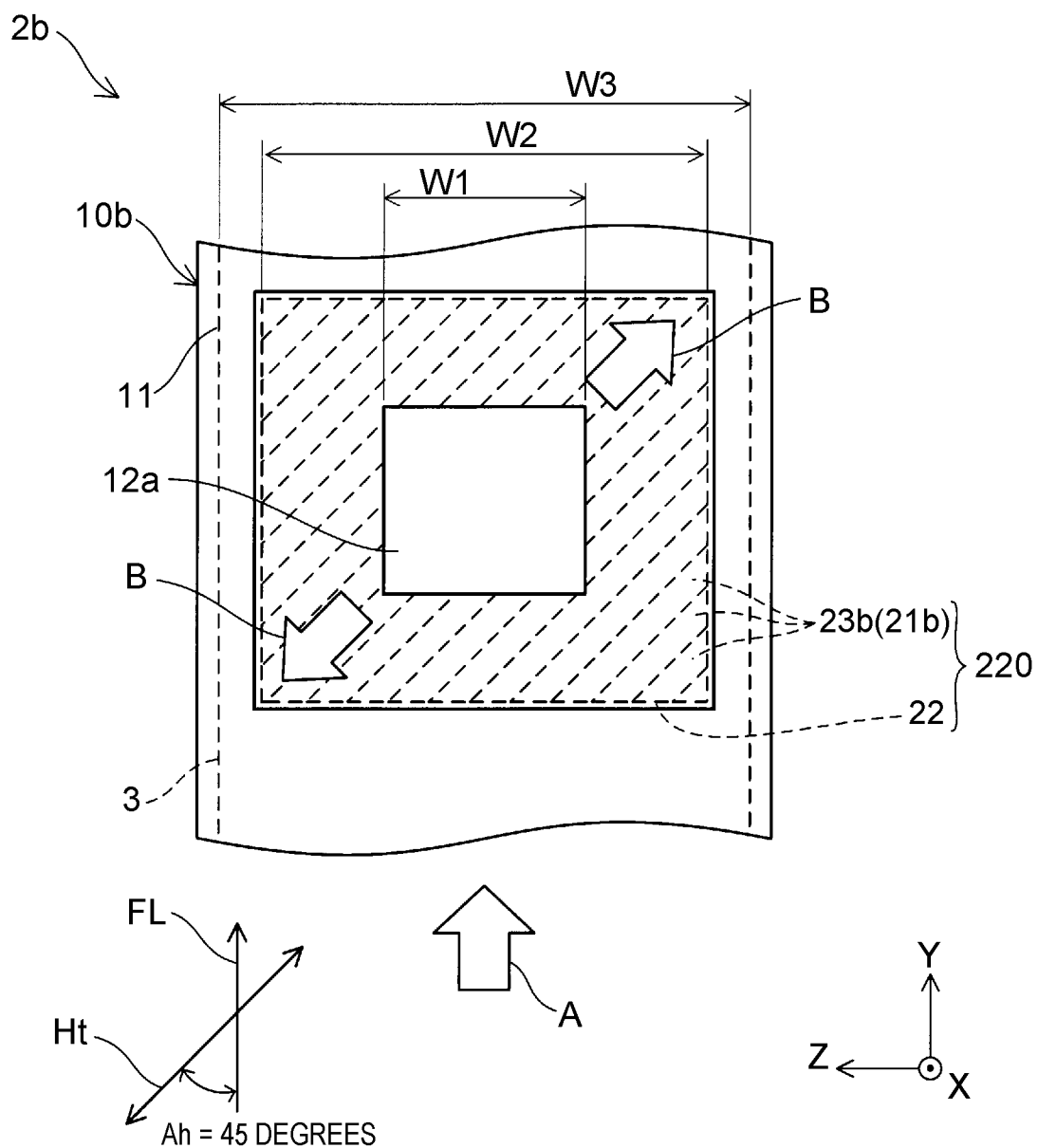
FIG. 7 is a sectional view of the semiconductor device of a second variation.

With reference to FIG. 7, a semiconductor device 2b of the second variation will be described. FIG. 7 is a view corresponding to FIG. 3, and is a sectional view of the semiconductor device 2b as viewed from the normal direction of the wide-width surface of the semiconductor element 12a. In FIG. 7, only outer outlines of the package 11 of each semiconductor module 10b are illustrated by solid lines, and the semiconductor element 12a and a heat sink 220 (copper plate 22 covering a heat conductive body 21b) embedded in the package 11 are illustrated by solid lines. An arrow A indicates a flow direction of the coolant.

Each heat conductive body 21b is formed by stacking multiple graphite sheets 23b. In FIG. 7, a reference numeral "23b" is added to some of the graphite sheets, and the reference numeral for the rest of the graphite sheets is omitted. Sheet surfaces of the graphite sheets 23b correspond to the high heat-transfer surface having a high heat conductivity. In FIG. 7, the high heat-transfer surface intersects an X-Y plane at an angle of 45 degrees.

An arrow line Ht illustrated at a lower position of FIG. 7 indicates the in-plane direction of the high heat-transfer surface. An arrow line FL indicates the flow direction of the coolant. FIG. 7 corresponds to a view as seen from the normal direction of the wide-width surface (surface facing the cooler 3) of the semiconductor element 12a. In the semiconductor device 2b of the second variation, as viewed from the normal direction of the wide-width surface of the semiconductor element 12a, the high heat-transfer surface (arrow line Ht) intersects the flow direction (arrow line FL) of the coolant at an angle of 45 degrees. The wide-width surface of the semiconductor element 12a is orthogonal to the high heat-transfer surface. In addition, the width W2 of the heat conductive body 21b is wider than the width W1 of the semiconductor element 12a, and the width W3 of the flow passage is wider than the width of the heat conductive body 21b.

Since the high heat-transfer surface intersects the flow direction of the coolant at an angle of 45 degrees, heat of the semiconductor element 12a spreads outward of the semiconductor element 12a toward the coolers 3. Arrows B in FIG. 7 schematically show a condition that the heat spreads outward from the semiconductor element 12a. The heat of the semiconductor element 12a is transferred so as to spread toward the coolers 3, thus enhancing cooling efficiency. The above advantageous effect can be obtained if the high heat-transfer surface and the flow direction of the coolant are non-parallel to each other; however, it is preferable that the high heat-transfer surface intersects the flow direction of the coolant at an angle of 45 degrees to 90 degrees. If this intersection is made at an angle of less than 45 degrees, the length of the heat transfer path along the high heat-transfer surface, necessary for transferring the heat to the direction orthogonal to the flow direction of the coolant, becomes longer. More preferably, the high heat-transfer surface is orthogonal to the flow direction of the coolant.

Figure 8:
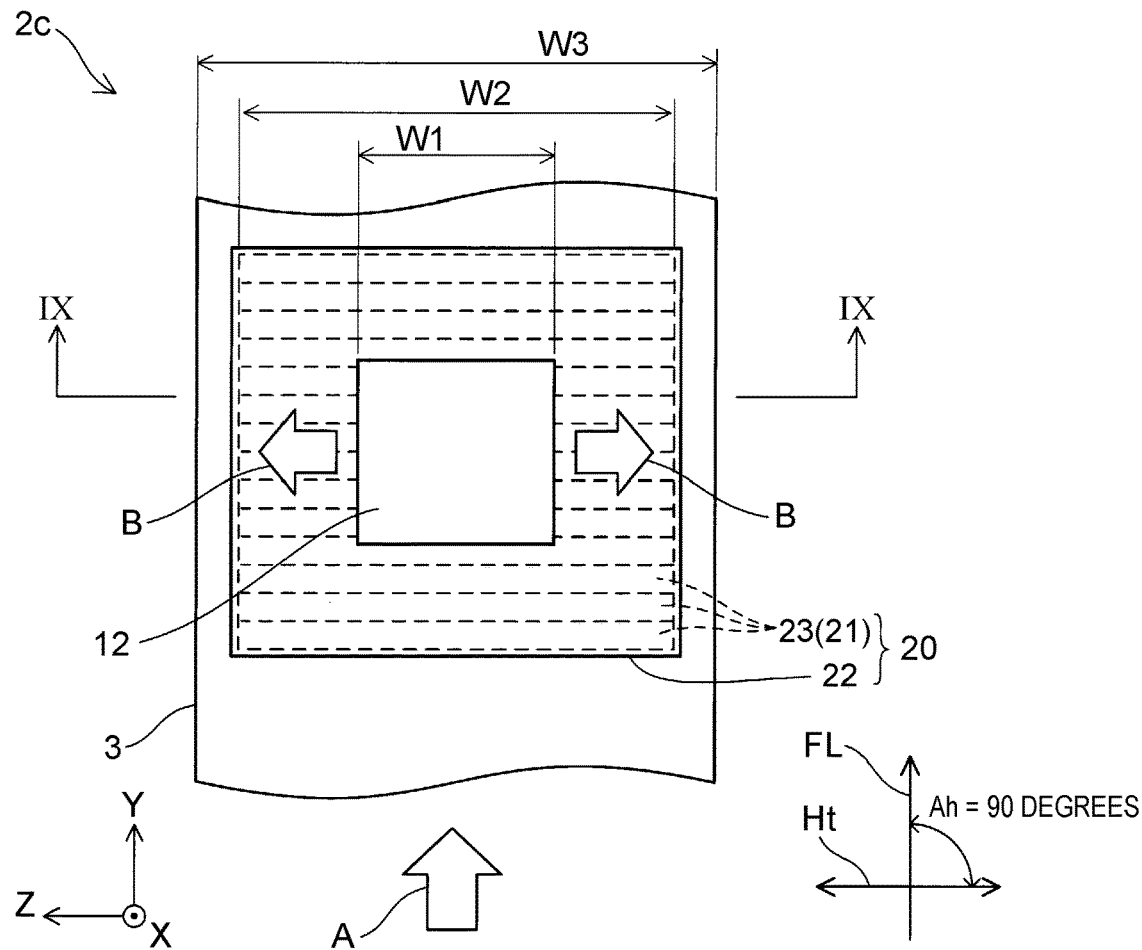
FIG. 8 is a plan view of a semiconductor device of a second embodiment.
Figure 9:
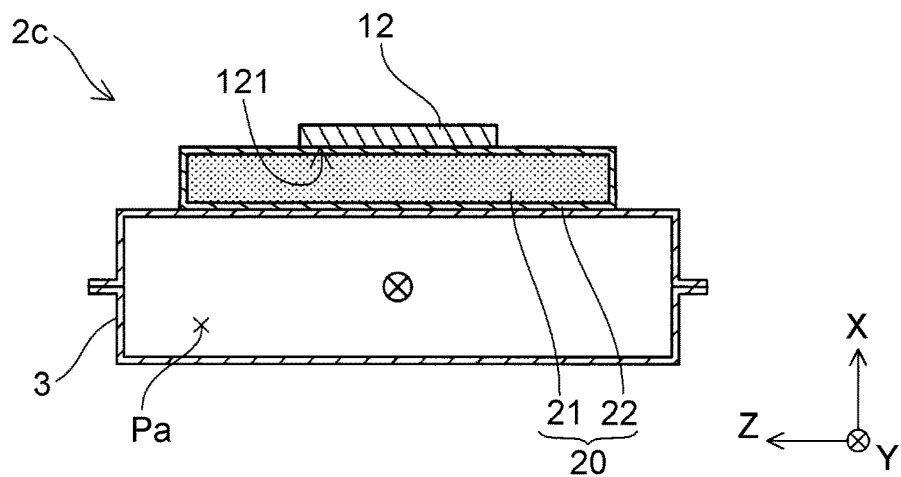
FIG. 9 is a sectional view taken along a line IX-IX of FIG. 8.

A semiconductor device 2c of the second embodiment will be described with reference to FIG. 8 and FIG. 9. FIG. 8 is a plan view of the semiconductor device 2c, and FIG. 9 is a sectional view thereof taken along a line IX-IX of FIG. 8. The semiconductor device 2c is a device formed by stacking the semiconductor element 12, the cooler 3, the heat sink 20 with the heat sink 20 interposed between the semiconductor element 12 and the cooler 3. The cooler 3 is the same cooler as that of the first embodiment, and the coolant flows in the direction +Y in the coordinate system of the drawing.

The semiconductor device 2c includes the semiconductor element 12, the cooler 3, and the heat sink 20. The cooler 3 faces the wide-width surface 121 of the semiconductor element 12, and includes a flow passage Pa of the coolant. When the cooler 3 is seen from the flow direction of the coolant (direction Y in the drawing), the width W3 of the flow passage Pa is wider than the width W1 of the semiconductor element 12. The heat sink 20 is held between the semiconductor element 12 and the cooler 3. The heat sink 20 is formed by covering the heat conductive body 21 made from graphite with the copper plate 22.

The heat conductive body 21 is formed by stacking the multiple graphite sheets 23. The graphite sheet 23 has a higher heat conductivity in the sheet surface direction than a heat conductivity in the normal direction of the sheet surface. Therefore, the heat conductive body 21 has such an anisotropy that a heat conductivity in the sheet surface direction of the graphite sheets 23 is higher than that a heat conductivity of the sheet surface in the normal direction of the sheet surface of the graphite sheets 23. The width W2 of the heat conductive body 21, as viewed from the flow direction of the coolant, is wider than the width W1 of the semiconductor element 12. In addition, in the heat conductive body 21, the surface having a high heat conductivity is non-parallel to both of the flow direction of the coolant and the wide-width surface 121 of the semiconductor element 12. More precisely, the heat conductive body 21 is disposed such that the surface thereof having a higher heat conductivity is orthogonal to both of the flow direction of the coolant and the wide-width surface 121 of the semiconductor element 12. An arrow line Ht in FIG. 8 indicates a direction of a higher heat conductivity, and an arrow line FL indicates the flow direction of the coolant. An intersection angle Ah between the arrow line Ht and the arrow line FL indicates an intersection angle between the flow direction of the coolant and the high heat-transfer surface. With the above structural characteristics, the semiconductor device 2c of the second embodiment can attain the same advantageous effect as that of the semiconductor device 2 of the first embodiment.

Remarks regarding the technique having been explained in the embodiments will be described. The semiconductor element is not limited to an IGBT or an MOSFET. The heat conductive body that is a stack of the graphite sheets may be covered with silver plating or the like, instead of being covered with the copper plate.

As described above, specific embodiments of the present disclosure have been described in detail; however, they are merely examples and do not limit the scope of the claims. The techniques described in the claims include various modifications and alterations of the above-exemplified specific embodiments. The technical elements described in the present specification and the drawings exert technical values alone or in various combinations and are not limited to the combination described in the claims at the time of filing. The techniques exemplified in the present specification or the drawings can achieve multiple purposes simultaneously and are technically valuable by merely achieving one of these purposes.

What is claimed is:

1. A semiconductor device comprising:
   a semiconductor element;
   a cooler that faces one surface of the semiconductor element and has a flow passage of a coolant, a width of the flow passage being wider than a width of the semiconductor element as viewed from a flow direction of the coolant; and
   a heat conductive body disposed between the semiconductor element and the cooler, the heat conductive body including graphite having such an anisotropy that a heat conductivity in an in-plane direction of a predetermined surface is higher than a heat conductivity in a normal direction of the predetermined surface, a width of the heat conductive body being wider than the width of the semiconductor element as viewed from the flow direction of the coolant, the heat conductive body being configured such that the predetermined surface is non-parallel to both of the flow direction of the coolant and the one surface of the semiconductor element.

2. The semiconductor device according to claim 1, wherein
   the predetermined surface of the graphite is orthogonal to the one surface of the semiconductor element.

3. The semiconductor device according to claim 1, wherein
   as viewed from the normal direction of the one surface of the semiconductor element, the predetermined surface of the graphite intersects the flow direction of the coolant at an angle within a range of 45 to 90 degrees.

4. The semiconductor device according to claim 1, wherein
   the heat conductive body is covered with metal.

* * * * *